United States Patent [19]  [11] 3,992,232
Kaji et al.  [45] Nov. 16, 1976

[54] METHOD OF MANUFACTURING SEMICONDUCTOR DEVICE HAVING OXIDE ISOLATION STRUCTURE AND GUARD RING

[75] Inventors: Tadao Kaji; Osamu Yumoto, both of Kokubunji; Michio Suzuki, Hino, all of Japan

[73] Assignee: Hitachi, Ltd., Japan

[22] Filed: July 17, 1975

[21] Appl. No.: 596,724

Related U.S. Application Data

[62] Division of Ser. No. 474,225, May 29, 1974.

[30] Foreign Application Priority Data

Aug. 6, 1973  Japan.............................. 48-87506

[52] U.S. Cl.................... 148/175; 29/578; 29/580; 148/187; 148/191; 357/50; 357/52
[51] Int. Cl.²................. H01L 21/76; H01L 21/22; H01L 27/04
[58] Field of Search................ 148/175, 187, 191; 357/50, 52; 29/578, 580

[56] References Cited
UNITED STATES PATENTS

| 3,341,755 | 9/1967 | Husher et al. | 357/49 X |
| 3,370,995 | 2/1968 | Lowery et al. | 148/175 |
| 3,648,125 | 3/1972 | Peltzer | 357/50 X |
| 3,748,545 | 7/1973 | Beale | 148/175 X |
| 3,796,612 | 3/1974 | Allison | 148/175 |
| 3,873,383 | 3/1975 | Kooi | 148/187 |

OTHER PUBLICATIONS

Kooi et al., "Selective Oxidation of Silicon - - - Applications," Semiconductor Silicon (Textbook), 1973, (Electrochem. Soc. Conf. Proc., May 13-18, 1973), pp. 860-879.
Peltzer et al., "Isolation Method - - - Memories," Electronics, Mar. 1, 1971, pp. 52-55.
Aarons, M. W., "Integrated Circuit Device - - - Technology," S.C.P. and Solid State Tech., Mar. 1965, pp. 42-45.

Primary Examiner—L. Dewayne Rutledge
Assistant Examiner—W. G. Saba
Attorney, Agent, or Firm—Craig & Antonelli

[57] ABSTRACT

In a method of manufacturing a semiconductor device, wherein an element forming a region of one conductivity type isolated by an oxide layer is disposed on a semiconductor substrate of the opposite conductivity type, a ring-shaped high impurity concentration region of the opposite conductivity type is formed on a portion of the semiconductor substrate so as to surround the isolated region to thereby prevent the formation of a parasitic channel and to stabilize the surface potential of the substrate.

14 Claims, 7 Drawing Figures

METHOD OF MANUFACTURING SEMICONDUCTOR DEVICE HAVING OXIDE ISOLATION STRUCTURE AND GUARD RING

This is a division of application Ser. No. 474,225, filed May 29, 1974.

BACKGROUND OF THE INVENTION

The present invention relates to a method of manufacturing semiconductor devices. More particularly, it is directed to a method of manufacturing a semiconductor integrated circuit device which has an insulator isolation structure.

DESCRIPTION OF THE PRIOR ART

In order to provide isolation in a semiconductor integrated circuit, the technique of utilizing a p-n junction is generally known. This isolating method, however, produces a comparatively large parasitic capacitance, and is not suitable for a semiconductor device having high speed operation.

Therefore, a technique is known and has been adopted in which an insulator isolation method is utilized, as illustrated in FIG. 2 of the accompanying drawings. Since according to this method, an isolation region 5 includes an $SiO_2$ film, the parasitic capacitance is sharply reduced, and the device is suitable for high speed operation. However, in the semiconductor device, a parasitic channel is likely to be formed on the surface of the semiconductor substrate 1 beneath the oxide film 5. Accordingly, the substrate 1 is provided with a channel stopper region 3; however, its effect is not satisfactory. Moreover, the substrate surface potential is unstable, which may cause erroneous operation of the transistor, noise, and the creation of a parasitic p-n-p transistor.

The present inventors have studied the cause of the problems in insulator isolation structure, and have discovered the following phenomena.

Impurity atoms in the $p^+$-type region 3, employed as the channel stopper region, diffuse into an environmental area, that is, an auto-doping phenomenon occurs in the process of producing the oxide film 5 and, hence, the impurity concentration of the $p^+$-type region 3 decreases. Simultaneously therewith, as the oxide film 5 is produced, the surface of the $p^+$-type region 3 is easily inverted, to form a chanel due to the effect of pushing out an n-type impurity (e.g. phosphorus) beneath the oxide film 5 or the absorption of a p-type impurity (e.g. boron) into the oxide film, $Na^+$ ions contained in the oxide film, etc. These conditions tend to decrease the desired effect of preventing a channel.

Moreover, due to a decrease in the impurity concentration of the $p^+$-type region 3, the resistance of the region increases, and the resistance between terminal 13 for supplying the lowest voltage to the substrate 1 and the portion of the substrate underlying collector 4 becomes large. Therefore, when the transistor is to effect a transition operation for a high frequency signal, the substrate potential fluctuates through the medium of the junction capacitance between the collector 4 and the substrate 1, and it becomes unstable. As a result, an adjoining transistor operates erroneously, noise occurs, or a parasitic p-n-p transistor is created.

SUMMARY OF THE INVENTION

The present invention has been made in order to overcome the above-mentioned problems, and has an as object the prevention of a parasitic channel in the oxide film isolation and in making the substrate potential stable.

The fundamental construction of the present invention for accomplishing this object consists in a semiconductor device having, on one principal plane of a semiconductor substrate of a first conductivity type, an element forming region of a second conductivity type insulated and isolated by an insulating film, the device being characterized by having a high impurity concentration region of the first conductivity type region on the semiconductor substrate around the element forming region.

BRIEF DESCRIPTION OF THE DRAWINGS

FIGS. 1a to 1f are sectional views showing various steps of a manufacturing process for a semiconductor device according to the present invention; while FIG. 2 is a sectional view of a prior-art semiconductor device previously referred to.

PREFERRED EMBODIMENT OF THE INVENTION

FIGS. 1a to 1f illustrate a process of manufacturing a semiconductor device according to the present invention. Description will now be made with reference to these figures.

Figure 1A:
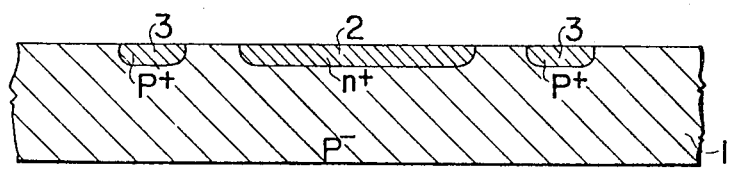

As is shown in FIG. 1a, in the surface of a $p^-$-type substrate 1 having a specific resistance of 20~30Ω cm, there are formed a p+ -type region 3, having a surface impurity concentration of $1.7 \times 10^{20}$ atoms/cm$^3$ and a depth of 1.5$\mu$, for a channel stopper and a buried n+ -type collector layer 2 having a surface impurity concentration of $1.7 \times 10^{20}$ atoms/cm$^3$ and a depth of 2.5$\mu$.

Figure 1B:
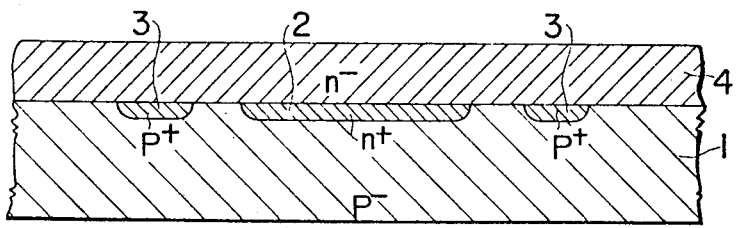

On the resultant substrate 1, as shown in FIG. 1b, an n− -type epitaxial layer which has a surface impurity concentration of $5 \times 10^{16}$ atoms/cm$^3$4 is grown to a thickness of approximately 2 to 3 $\mu$. The n× -type epitaxial layer 4 may be grown by hydrogen reduction of $SiCl_4$ (the mol ratio of $SiCl_4$ being 0.01) including 10 ppm of $PH_3$ (flow rate 40cc/min.) as a dopant at a temperature 1150° C for four minutes.

Subsequent to the epitaxial growth of the silicon layer 4, on the epitaxial silicon layer 4, a silicon nitride film 6 is deposited by the reaction of a mixed gas, with a flow rate of 300cc/min. of $SiH_4$ diluted by nitrogen ($SiH_4$ : 4%) and $NH_3$ at a flow rate of 360cc/min. at a temperature of 800° C for 4 minutes. The resulting thickness of the silicon nitride film 6 is about 1800 A. The silicon nitride film 6 is selectively etched to form an oxidation resistive mask, by covering selective portions with photoresistive layers, and etching portions of the silicon nitride film 6 not covered with the resistive layers in hot phosphoric acid at 170° C for 13 minutes.

A silicon dioxide film may be interposed between the silicon nitride film 6 and the n− -type epitaxial layer 4 by oxidizing the surface of the silicon layer 4 in a dry oxygen atmosphere at 1000° C for 30 minutes before deposition of the nitride film 6. The silicon oxide film avoids formation of defects in the surface of silicon layer 4 beneath the silicon nitride film 6.

Figure 1C:
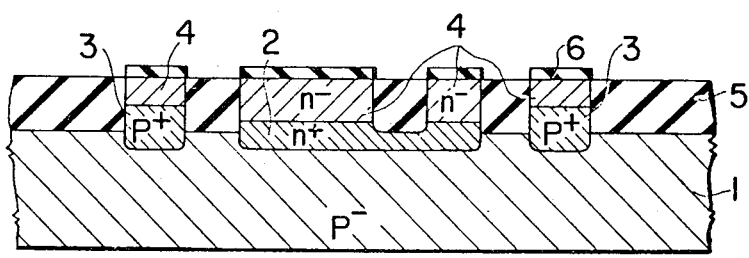

Next, with reference to FIG. 1c, the silicon epitaxial layer 4 is selectively oxidized through the use of the mask 6 in dry $O_2$, at a temperature of 1000° C for 16 hours to form an isolating oxide region 5. During the oxidation, p-type and n-type impurity atoms of p+-type region 3 and n+ -type region 2 diffuse into the silicon epitaxial layer 4, respectively.

Figure 1D:
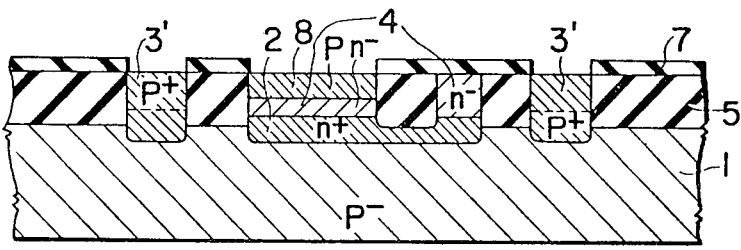

Next, with reference to FIG. 1d, the $Si_3N_4$ film 6 is removed by etching silicon nitride in a hot phosphoric acid at a temperature of 170° C for 15 minutes. Then, an $SiO_2$ film 7 is formed on selected areas by thermal oxidation process or chemical vapor deposition ( CVD ) process.

For example, according to the CVD process, the CVD $SiO_2$ film 7 may be formed by the oxidation of $SiI_4$ at a low temperature of 410° C for 7 minutes.

The resulting thickness of $SiO_2$ film 7 is about 3400A. Using the $SiO_2$ film 7 as a mask, a p-type impurity, e.g. boron is diffused into the epitaxial layer 4 overlying the p+ -type region 3 simultaneously with the diffusion for a base region 8. That portion of the epitaxial layer 4 over the p+ -type region 3 is converted to p+ -type (region 3') up to the surface thereof.

Figure 1E:
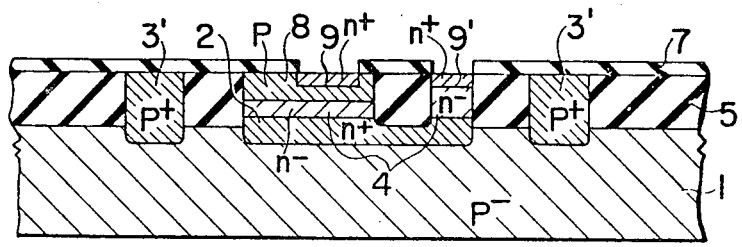

Then, as shown in FIG. 1e, using an $SiO_2$ film 7' as a mask, an emitter region 9, which has a surface impurity concentration of $5 \times 10^{21}$ atoms/$cm^3$ and a depth of 0.4μ, is formed by diffusion. During this step, an n+ -type high concentration layer 9' for leading out a collector electrode is formed simultaneously with the emitter region 9.

Figure 1F:
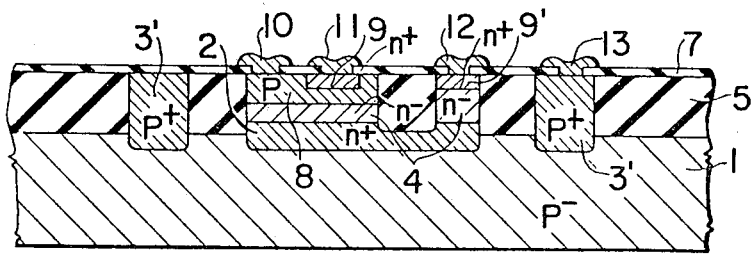
Figure 2:
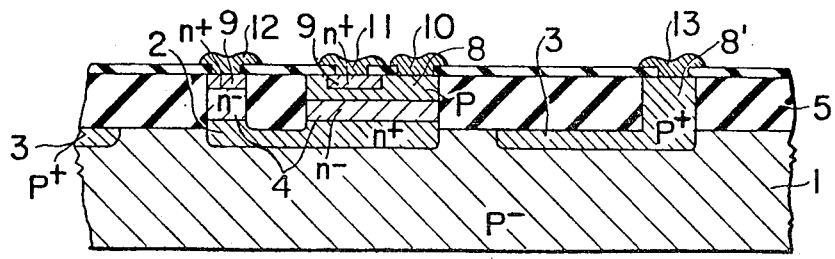

Thereafter, as shown in FIG. 1f, a base electrode 10 of aluminum an emitter electrode 11 of aluminum, a collector electrode 12 of aluminum and a substrate connecting terminal 13 are formed.

A semiconductor device formed according to the above method possesses the following characteristics. Sine the oxide film 5 is not formed on the p+ -type region 3 to be used as the channel stopper, the device is not subject to the impurity push-out effect due to the oxide film, absorption of boron into the oxide film and the influence of Na+ ions in the oxide film, as in the prior art. Furthermore, since the p-type impurity is introduced at the same time as the formation of the base region, the channel stopper region is formed up to the surface of the epitaxial layer, and the formation of a parasitic channel can be perfectly checked. In addition, the supply voltage for the substrate 1 is connected by utilizing the channel stopper region having a high impurity concentration so that the resistance of this region is very low. Accordingly, the voltage supplied to the substrate lying just beneath the collector can be sharply improved with respect to the prior art. Thus, the erroneous operation of an adjoining transistor and the generation of noise, or the formation of a parasitic p-n-p transistor can be prevented.

The present invention can adopt a variety of forms in additional to the foregoing embodiment. For example, the invention is also applicable to a semiconductor device which has no $n^+$ -type collector region. The channel stopper region may also be formed by diffusion from the surface of the epitaxial layer after the formation of the oxide film.

While we have shown and described one embodiment in accordance with the present invention, it is understood that the same is not limited thereto but is susceptible of numerous changes and modifications as known to a person skilled in the art and we, therefore, do not wish to be limited to the details shown and described herein but intend to cover all such changes and modifications as are obvious to one of ordinary skill in the art.

We claim:

1. A method of manufacturing a semiconductor device comprising the steps of:
   a. selectively forming a ring-shaped first semiconductor region having a relatively high impurity concentration of a first conductivity type in a principal surface of a semiconductor substrate of said first conductivity type of a relatively low impurity concentration;
   b. epitaxially forming a semiconductor layer of a second conductivity type, opposite said first conductivity type, on said principal surface of said substrate;
   c. selectively oxidizing said epitaxial layer through the thickness thereof to the principal surface of said substrate except for at least that portion of the epitaxial layer overlying said first semiconductor region and except for an additional portion thereof surrounded by and separated from said ring-shaped first semiconductor region, so that oxidized material of said epitaxial layer separates and isolates a ring-shaped non-oxidized portion of said epitaxial layer overlying said ring-shaped first semiconductor region from the non-oxidized additional portion of said epitaxial layer; and
   d. converting that portion of said epitaxial overlying said first semiconductor region to said first conductivity type.

2. A method according to claim 1, further comprising the step of
   e. forming a second semiconductor region of said first conductivity type in said additional portion of said epitaxial layer; and
   f. forming electrodes on said converted epitaxial layer overlying said first region and on said second semiconductor region.

3. A method of manufacturing semiconductor device according to claim 2 further comprising the step of
   g. forming a third semiconductor region of said second conductivity type in said second semiconductor region; and
   h. forming a forth semiconductor region of said second conductivity type and having a relatively high impurity concentration in part of said additional portion of said epitaxial layer other than the part thereof wherein said second semiconductor region is formed.

4. A method of manufacturing semiconductor device according to claim 3, wherein said third semiconductor region is of a relatively high impurity concentration and steps (g) and (h) are carried out simultaneously.

5. A method of manufacturing semiconductor device according to claim 3, further comprising the step of
   i. forming electrodes on said third and fourth semiconductor regions.

6. A method of manufacturing semiconductor device according to claim 1, wherein said step (d) comprises the step of
   d1. outdiffusing said first semiconductor region into a portion of said epitaxial layer during step (c) and
   d2. subsequently introducing impurities of said first conductivity type into said overlying portion of said epitaxial layer to reach said outdiffused first semiconductor region at a relatively high impurity concentration.

7. A method of manufacturing semiconductor device according to claim 1, wherein said additional portion of said epitaxial layer is surroundingly spaced from said first semiconductor region by an oxidized portion of said epitaxial layer.

8. A method of manufacturing semiconductor device according to claim 6, further comprising the step of (e) forming a second semiconductor region of said first conductivity type in said additional portion of said epitaxial layer simultaneously with step (d2).

9. A method of manufacturing a semiconductor device comprising the steps of:
   a. selectively forming a ring-shaped first semiconductor region having a relatively high impurity concentration of a first conductivity type in a principal surface of a semiconductor substrate of said first conductivity type of a relatively low impurity concentration;
   b. epitaxially forming a semiconductor layer of a second conductivity type opposite said first conductivity type on said principal surface of said semiconductor substrate;
   c. selectively oxidizing said epitaxial layer, through the thickness thereof to said principal surface of said substrate except for a first portion thereof and a second portion of the epitaxial layer overlying said first semiconductor region surrounding said first portion and being spaced apart from said first portion by insulating material therebetween; and
   d. introducing an impurity of said first conductivity type into said second portion of said epitaxial layer, so as to convert at least the entirety of said second portion of said epitaxial layer into a high impurity concentration first conductivity type region surrounding said first portion of said epitaxial layer.

10. A method according to claim 9, further comprising the step of
   e. forming a second semiconductor region of said first conductivity type in said first portion of said epitaxial layer, and,
   f. forming electrodes on said converted second portion of said epitaxial layer and said second semiconductor region.

11. A method according to claim 9, further comprising the step of
   e. forming a second semiconductor region of said first conductivity type in said first portion of said epitaxial layer, and
   f. forming electrodes on said converted second portion of said epitaxial layer and said second semiconductor region.

12. A method according to claim 10, further comprising the step of
   g. forming a third semiconductor region of said second conductivity type in said second semiconductor region, and
   h. forming a fourth semiconductor region of said second conductivity type and having a relatively high impurity concentration in part of said first portion of said epitaxial layer other than the part thereof wherein said second semiconductor region is formed.

13. A method according to claim 12, wherein said third semiconductor region is of a relatively high impurity concentration and steps (g) and (h) are carried out simultaneously.

14. A method according to claim 12, further comprising the step of
   i. forming electrodes on said third and fourth semiconductor regions.

* * * * *